United States Patent [19]

Birrittella

[11] Patent Number: 4,593,457

[45] Date of Patent: Jun. 10, 1986

[54] METHOD FOR MAKING GALLIUM ARSENIDE NPN TRANSISTOR WITH SELF-ALIGNED BASE ENHANCEMENT TO EMITTER REGION AND METAL CONTACT

[75] Inventor: Mark S. Birrittella, Phoenix, Ariz.

[73] Assignee: Motorola, Inc., Schaumburg, Ill.

[21] Appl. No.: 682,507

[22] Filed: Dec. 17, 1984

[51] Int. Cl.⁴ ............... H01L 21/161; H01L 21/203; H01L 21/263
[52] U.S. Cl. ..................... 29/576 B; 148/1.5; 148/175; 148/187; 148/DIG. 84; 357/34; 357/61; 357/91
[58] Field of Search ............ 29/576 B; 148/175, 1.5, 148/187; 357/34, 61, 91

[56] References Cited

U.S. PATENT DOCUMENTS

| | | | |
|---|---|---|---|
| 4,380,774 | 4/1983 | Yoder | 357/34 |
| 4,428,111 | 1/1984 | Swartz | 29/576 E |
| 4,494,995 | 1/1985 | Alavi et al. | 148/1.5 |
| 4,539,743 | 9/1985 | Anthony et al. | 29/576 B |

OTHER PUBLICATIONS

Yuan et al., Electronics Letts. 16 (1980) 637.
Hayes et al., Electronics Letts. 19 (May 1983) 410.
Vescan et al., Electronics Letts. 18 (1982) 533.
Asbeck et al., IEEE—GaAs IC Symposium, 1984, pp. 133–136.
Asbeck et al., IEEE—GaAs IC Symposium, 1983, pp. 170–173.

Primary Examiner—Upendra Roy
Attorney, Agent, or Firm—William E. Koch

[57] ABSTRACT

A gallium arsenide transistor is provided having a self-aligned base enhancement to emitter region and a method of applying metal to the emitter region. A series of steps provide an NPN structure overlying a substrate and includes an N region of aluminum gallium arsenide overlying a P base region for increasing the efficiency of the base-emitter junction by eliminating the need for a very heavily doped emitter at the surface of the chip. Two masking layers, one overlying the other, are deposited over the N emitter region and are patterned by known photoresist methods. The P base region is enhanced by implanting beryllium ions therein and partially into the N collector region. This ion implantation is blocked by the masking layers, creating a base enhancement region aligned with the emitter region. An etching process then undercuts the lower masking layer before the upper masking layer is removed. A photoresist is deposited on the surface and the lower masking layer is removed. Metal is deposited on the surface of the photoresist and the emitter region. The photoresist is then removed, thereby lifting off the metal thereon, leaving a metal contact on a portion of the emitter reigon.

9 Claims, 1 Drawing Figure

STEP 1: 11

STEP 2: N+ 12 / 11

STEP 3: N 13 / N+ 12 / 11

STEP 4: P 14 / N 13 / N+ 12 / 11

STEP 5: N 15 / P 14 / N 13 / N+ 12 / 11

STEP 6: N+ 16 / N 15 / P 14 / N 13 / N+ 12 / 11

STEP 7: 17 / N+ 16 / N 15 / P 14 / N 13 / N+ 12 / 11

STEP 8: 18 / 17 / N+ 16 / N 15 / P 14 / N 13 / N+ 12 / 11

STEP 9: 18 / 17 / N+ 16 / N 15 / P 14 / N 13 / N+ 12 / 11

STEP 10: 18 / 17 / N+ 16 / N 15 / P 14 / N 13 / N+ 12 / 11

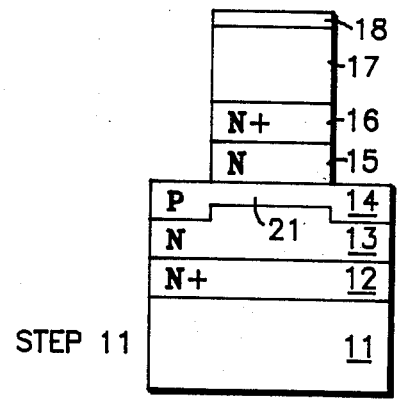
STEP 11
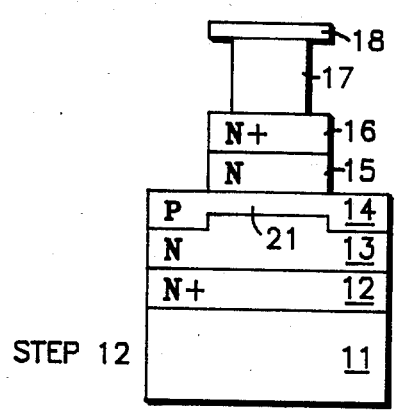
STEP 12
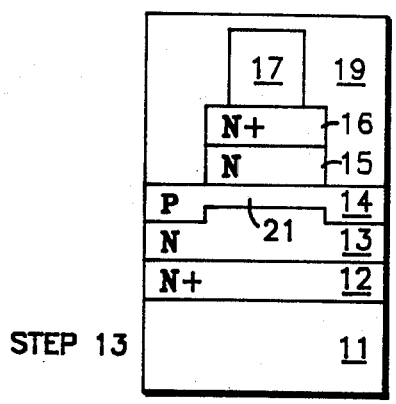
STEP 13
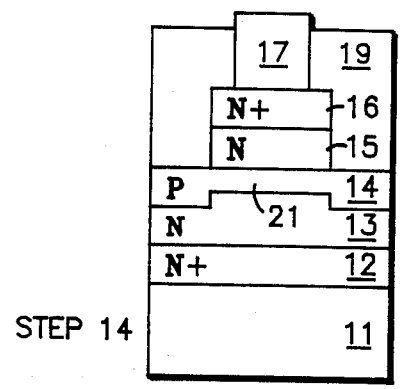
STEP 14
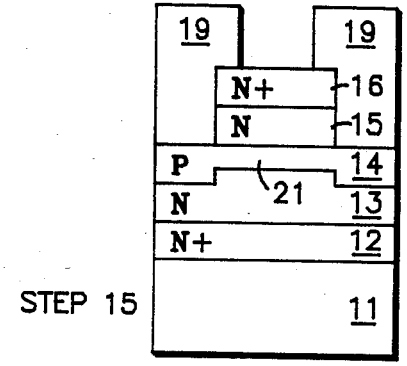
STEP 15
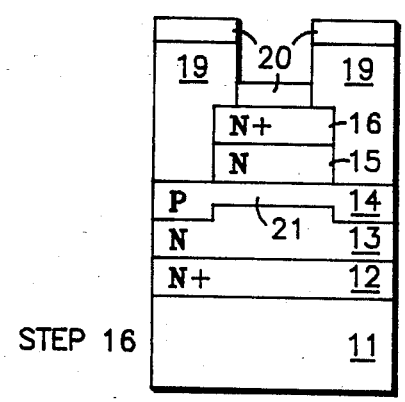
STEP 16
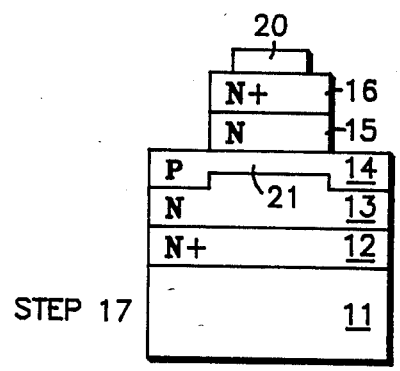
STEP 17

METHOD FOR MAKING GALLIUM ARSENIDE NPN TRANSISTOR WITH SELF-ALIGNED BASE ENHANCEMENT TO EMITTER REGION AND METAL CONTACT

BACKGROUND OF THE INVENTION

1. Field of the Invention

This invention relates generally to binary III-V compound NPN transistors and, more particularly, to a gallium arsenide (GaAs) transistor having a self-aligned base enhancement to emitter region and an improved method of applying metal to the emitter region.

2. Background Art

Semiconductor integrated circuits include a plurality of transistors, diodes, and the like formed by creating a variety of doped regions in a semiconductor wafer substrate. These regions are formed by performing a number of operations, for example, epitaxial growth, diffusions, ion implantations, etching processes, etc. These operations normally are carried out by a number of masking steps. The devices are then interconnected by a conductive metallization layer to form the desired circuit function.

Self-alignment of a transistor may be defined as the ability to define the edge of the extrinsic base of a transistor in close proximity to the edge of the active emitter-base junction in a manner that does not use photolithography techniques to define that spacing. Many self-aligned silicon NPN transistor structures and methods for the fabrication thereof have been proposed in the past that are able to provide reliable devices having a high yield in manufacture. However, self-aligned GaAs bipolar transistor structures and methods for the fabrication thereof have heretofore not been known. Furthermore, metal contact widths have been limited by minimum masking dimensions, thus requiring the emitter or collector regions on the semiconductor surface to have an area greater than the minimum masking width possible so as to prevent the metal from shorting to the base.

Thus, a method of fabricating a GaAs transistor having a self-aligned base enhancement to emitter region and an improved method of applying a metal contact having a width less than minimum masking dimensions is needed.

SUMMARY OF THE INVENTION

Accordingly, it is an object of the present invention to provide an improved GaAs transistor.

Another object of the present invention is to provide an improved GaAs transistor having a self-alligned base enhancement to emitter region.

Yet another object of the present invention to provide an improved method of applying metal to a region on the semiconductor surface.

In carrying out the above and other objects of the invention in one form, there is provided a method for fabricating a binary III-V compound transistor comprising the steps of forming a first, second and third layer overlying one another and having a first, second and first type conductivity, respectively; forming a first and second masking layer overlying said third layer and a second masking layer overlying said first masking layer; selectively etching away said third layer not underlying said first masking layer; and enhancing said second region by implanting ions thereinto so that a portion of said first region assumes a conductivity of said second type, said portion being aligned with but not underlying said first masking layer.

The above and other objects, features, and advantages of the present invention will be better understood from the following detailed description taken in conjunction with the accompanying drawings.

BRIEF DESCRIPTION OF THE DRAWING

The single FIGURE illustrates cross sectional views of a series of steps showing the fabrication process for producing the active region of a self-aligned semiconductor transistor structure and the improved method of depositing metal on the semiconductor surface in accordance with the method of this invention.

DETAILED DESCRIPTION OF THE INVENTION

Referring to the active region of the semiconductor transistor structure of the FIGURE, Step 1 illustrates a gallium arsenide (GaAs) substrate 11 shown in this example to be of semi-insulating conductivity. Although GaAs is used when referring to the material of the structure, it is understood that any binary III-V compound could be used. The substrate 11 may have a thickness of about 15 mils. It should be evident to those skilled in the art that the semiconductor regions shown to be of one type conductivity in the drawing can be substituted by semiconductor regions of the opposite conductivity, if desired, in order to produce a PNP transistor structure rather than the NPN transistor structure illustrated in the drawing.

In Step 2, an N+ GaAs layer 12 is epitaxially grown on semi-insulating substrate 11 and serves as either a collector or emitter of an NPN transistor. Although any of several growth techniques may be used for the layers described herein, molecular beam epitaxy (MBE) is preferred. MBE involves the use of selected molecular beams for condensation on a heated substrate in an ultra-high vacuum environment. Due to the relatively slow growth rate and low substrate temperature, very precise epilayer thickness and abrupt doping profiles can be obtained. Preferably, the N+ type region 12 has a thickness of about 0.5 microns and an impurity concentration of approximately $5*10^{18}$ to $10^{19}$ impurities per cubic centimeters of GaAs. The N type dopant used in epitaxial layer 12 may be either silicon, selenium or some other N type dopant.

In Step 3, an N type region 13 is epitaxially grown on N+ region 12. Preferably, N region 13 has a thickness of about 0.5-1.0 microns and an impurity concentration of approximately $10^{16}$ to $5*10^{16}$ impurities per cubic centimeters of GaAs. N type region 13 may comprise aluminum gallium arsenide, for the reasons stated in Step 5, when N type region 12 serves as an emitter.

In Step 4, a P type region 14 is epitaxially grown on N region 13 and serves as a base of the transistor. P region 14 preferably has an impurity concentration of $10^{18}$ to $5*10^{18}$ impurities per cubic centimeters of GaAs. P type region 14 would, for example, have a depth of 0.1-0.2 micron and would contain a P type dopant such as beryllium.

In Step 5, an N type region 15 is epitaxially grown on P region 14 and comprises aluminum GaAs (AlGaAs). AlGaAs increases the efficiency of the base-emitter junction and eliminates the need for a heavily doped emitter at the surface of the chip. N region 15 is preferably about 0.01-0.1 microns in thickness and an impurity concentration of approximately $10^{17}$ to $10^{18}$ impurities per cubic centimeters of GaAs.

In Step 6, an N+ type region 16 is epitaxially grown on N region 15 and serves as either an emitter or collector of the transistor. N+ region 16 preferably has a thickness of about 0.05–0.20 microns and an impurity concentration of about $10^{19}$ impurities per cubic centimeters of GaAs.

In Step 7, a silicon dioxide layer 17 is preferably deposited on the N+ region 16 in order to provide a masking layer. For example, a silicon dioxide ($SiO_2$) layer having a thickness of approximately 5000 Angstroms has been shown to be beneficial for use as the masking layer.

In Step 8, a silicon nitride ($Si_3N_4$) layer 18 is preferably deposited on the silicon dioxide layer 17 in order to provide a masking layer. For example, a silicon nitride layer having a thickness of approximately 1000 Angstroms has been shown to be beneficial for use as a masking layer. $SiO_2$ and $Si_3N_4$ are only suggested for the masking layers of Steps 7 and 8. Other materials may easily be used.

In Step 9, photoresist is patterned on layer 18 in a manner known to those skilled in the art. Reactive ion etching is used to reduce silicon dioxide layer 17 and silicon nitride layer 18 as shown.

In Step 10, an N GaAs etch is used to remove a portion of N+ layer 16 and N layer 15 using silicon nitride layer 18 and silicon dioxide layer 17 as a mask.

In Step 11, P region 14 is enhanced by implanting beryllium ions into P region 14 and partially into N− region 13 using silicon nitride layer 18 and silicon dioxide layer 17 as a mask, thereby causing the enhancement to be self-aligned with N region 15 and N+ region 16. This enhancement reduces the resistance associated with P region 14.

In Step 12, an oxide etch is used to preferentially etch a portion of the silicon dioxide layer 17 in order to achieve the undercutting configuration shown. In this manner, a very precise etching operation can be carried out to carefully control the lateral spacing of a metal deposition formed subsequently. An etch is then used to remove silicon nitride layer 18.

In step 13, a photoresist material 19 is deposited on the surfaces of P region 14, N region 15, N+ region 16 and silicon dioxide layer 17 as shown.

In step 14, a plasma or reactive ion etch is performed on the photoresist 19 until the surface of silicon dioxide layer 17 is exposed.

In Step 15, an oxide etching operation is caried out to preferentially remove only the silicon dioxide layer 17 thereby leaving an opening in photoresist 19 and exposing a portion of N+ region 16.

In Step 16, preferably a gold germanium nickel (AuGe Ni) ohmic metal contact is made to N+ region 16 by depositing, for example, a 5000 Angstrom total metal material 20 onto the top surface of the semiconductor structure shown in Step 15.

In Step 17, photoresist 19 is removed thereby lifting off the metal thereon, leaving metal 20 as deposited on N+ region 16.

This method for fabricating an NPN GaAs transistor has a self-aligned base enhancement region 14 with respect to the intrinsic base region 21 and emitter region 15 of the device. Silicon dioxide layer 17 is used to define the intrinsic base region 21 and emitter region 15 and the extrinsic base enhancement region 14. Another advantage of this invention is in providing a method for the self-aligned metal contact to the emitter which eliminates the possibility of base-emitter shorts. This method allows for the emitter width to be equal to the minimum photolithography defined opening available in a given process. Metal 20 width ends up to be less than this minimum dimension. A more conventional technique would require that the emitter width be equal to the minimum design rule spacing plus two photo alignment tolerances to allow for subsequent alignment of the metal contact to the emitter region.

By now it should be appreciated that there has been provided a GaAs transistor having a self-aligned base enhancement to emitter region and a method of applying metal to the emitter region.

I claim:

1. A method for fabricating a binary III-V compound, self-aligned transistor device comprising the steps of:
    forming a first active layer having a first conductivity type overlying a substrate;
    forming a second active layer having a second conductivity type overlying said first active layer;
    forming a third active layer having said first conductivity type overlying said second active layer;
    forming a first masking layer overlying a portion of the surface of said third active layer;
    forming a second masking layer overlying said first masking layer
    selectively etching away said third active layer not underlying said first masking layer; and
    enhancing said second layer by implanting ions thereinto so that a portion of said first layer assumes a conductivity of said second type, said portion being aligned with but not underlying said first masking layer.

2. The method according to claim 1 wherein said enhancing step comprises implanting beryllium ions.

3. The method according to claim 1 further comprising the steps of:
    etching away a perpherial portion of said first masking layer by undercuting said second masking layer;
    etching away said second masking layer;
    forming a photoresist over said second layer and third layer and surrounding but not overlying said first masking layer;
    etching away said first masking layer;
    forming a metal on the portion of said third region within the opening left by etching away said first masking layer; and
    removing said photoresist.

4. The method according to claim 1 wherein said first, second and third active layers comprise gallium arsenide.

5. The method according to claim 1 wherein said first masking layer comprises silicon dioxide.

6. The method according to claim 2 wherein said metal comprises gold, germanium and nickel.

7. The method according to claim 3 wherein said forming a photoresist step comprises the steps of:
    forming a photoresist over said second layer, said third layer and said first masking layer; and
    etching a portion of said photoresist to expose the upper surface of said first masking layer.

8. The method according to claim 4 further comprising the step of forming a fourth active layer of aluminum gallium arsenide interposed between said second active layer and said third active layer.

9. The method according to claim 5 wherein said second masking layer comprises silicon nitride.

* * * * *